(12) United States Patent
Winters

(10) Patent No.: US 7,524,226 B2
(45) Date of Patent: Apr. 28, 2009

(54) OLED DISPLAY DEVICE WITH ADJUSTED FILTER ARRAY

(75) Inventor: Dustin L. Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 378 days.

(21) Appl. No.: 11/548,040

(22) Filed: Oct. 10, 2006

(65) Prior Publication Data

US 2008/0085652 A1 Apr. 10, 2008

(51) Int. Cl.
*H01J 9/00* (2006.01)

(52) U.S. Cl. .................... 445/3; 445/4; 445/24; 445/25

(58) Field of Classification Search .................... 445/3, 445/4, 24, 25
See application file for complete search history.

(56) References Cited

U.S. PATENT DOCUMENTS

| | | | |
|---|---|---|---|
| 4,356,429 A | 10/1982 | Tang | |
| 5,521,035 A | 5/1996 | Wolk et al. | |
| 5,550,066 A | 8/1996 | Tang et al. | |
| 6,392,340 B2 | 5/2002 | Yoneda et al. | |
| 6,737,800 B1 | 5/2004 | Winters et al. | |
| 6,743,556 B2 | 6/2004 | Elizur et al. | |
| 6,762,735 B2 | 7/2004 | Koyama | |
| 6,771,028 B1 | 8/2004 | Winters | |
| 6,919,681 B2 | 7/2005 | Cok et al. | |
| 6,957,995 B2 | 10/2005 | Kuo | |
| 6,961,032 B2 | 11/2005 | Winters | |
| 7,012,588 B2 | 3/2006 | Siwinski | |
| 2002/0024051 A1 | 2/2002 | Yamazaki et al. | |
| 2003/0214248 A1 | 11/2003 | Yushi | |
| 2004/0113875 A1 | 6/2004 | Miller et al. | |
| 2004/0201558 A1 | 10/2004 | Arnold et al. | |
| 2005/0023523 A1 | 2/2005 | Koji | |

FOREIGN PATENT DOCUMENTS

| | | | |
|---|---|---|---|
| JP | 06-138485 | | 5/1994 |
| JP | 2007025303 A | * | 2/2007 |

* cited by examiner

*Primary Examiner*—Mariceli Santiago
(74) *Attorney, Agent, or Firm*—Raymond L. Owens

(57) ABSTRACT

A method of making an OLED display device for producing an image includes forming an array of light producing elements; testing the array of light producing elements and recording the location of defective light producing element(s); providing a default pattern of the array of color filter elements having at least two different colors; and forming an array of color filter elements in response to the recorded location of the defective light producing element(s), the location of at least one color filter element being changed from the default pattern.

18 Claims, 14 Drawing Sheets

OLED DISPLAY DEVICE WITH ADJUSTED FILTER ARRAY

CROSS REFERENCE TO RELATED APPLICATIONS

Reference is made to commonly assigned U.S. patent application Ser. No. 11/040,066 filed Jan. 21, 2005 entitled "Method and Apparatus for Defect Correction in a Display" by Ronald S. Cok; U.S. patent application Ser. No. 11/274,467 filed Nov. 15, 2005 entitled "Method and Apparatus for Defect Correction in a Display" by Ronald S. Cok et al; and U.S. patent application Ser. No. 11/289,986 filed Nov. 30, 2005 entitled "OLED Devices with Color Filter Array Units" by Dustin L. Winters, the teachings of which are incorporated herein.

FIELD OF THE INVENTION

The present invention relates to making OLED display devices with an array color filter elements that is changed in response to defective light producing elements.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display.

OLED display devices have been fabricated with active matrix (AM) driving circuitry in order to produce high performance displays. An example of such an AM OLED display device is disclosed in U.S. Pat. No. 5,550,066. However, in this type of display device, when light is emitted downward through the substrate, the overall area that can emit light is limited by the presence of thin film transistors (TFT's) and other circuitry, which are opaque. The area of the display pixels that emits light relative to the total area of the pixels is known as the aperture ratio (AR) and is typically less than 50% in such displays. In order to compensate for lower AR, the device must be driven at a higher current density compared to a device with a high AR. The result is that the lower AR devices use more power and have a shorter useable life than a device with a higher AR.

Therefore, much work has been done to produce AM OLED display devices that are top-emitting (or surface-emitting), that is, where light is removed through the upper surface away from the substrate and active matrix circuitry. Such a display device is described in U.S. Pat. No. 6,737,800. This top-emitting configuration allows for increased AR and therefore improved performance of the display.

One approach to forming a multi-color display device involves the use of a broadband light-emitting EL structure, such as a white light-emitting EL structure coupled with a multi-colored array of color filter elements. In this configuration, a single organic EL layer structure can be applied to all pixels, and the color perceived by the viewer is dictated by that pixel's corresponding color filter element. Therefore, a multicolor or RGB device can be produced without requiring any patterning of the organic EL layers. Such white-light top-emitting AM display devices with CFA's can offer superior AR, manufacturing yield, and production throughput compared to top-emitting AM display devices with multi-color patterning. An example of a white CFA top-emitting display device is shown in U.S. Pat. No. 6,392,340.

Multi-color OLED display devices have also recently been described that are constructed with four differently colored pixels. One example of such a four pixel display includes pixels that are red, green, blue, and white in color. This configuration is known as an RGBW type display. Examples of such four pixel displays are shown in U.S. Pat. Nos. 6,771,028, 7,012,588, U.S. Patent Application Publications 2004/0113875 A1, and 2004/0201558 A1. Such RGBW displays can be constructed using a white organic EL emitting layer with red, green, and blue color filters for the red, green, and blue pixels, respectively. The white pixel area is left unfiltered. Inclusion of the unfiltered white pixel allows for the display of colors that are less than fully saturated at reduced power consumption compared to similar RGB only, filtered broadband OLED displays.

When manufacturing organic EL displays, problems such a particle contamination or scratches in the organic EL materials can result in defects in a display. One type of defect that is caused by particle contamination or scratches is a short circuit through the thin organic materials, connecting the anode and the cathode. A short between the anode and cathode results in a non-emitting pixel (dead pixel) or a pixel that emits at reduced brightness (dim pixel).

Similarly, defects due to particles, scratches, mask-errors, electrostatic discharge (ESD), and similar manufacturing problems can occur in the manufacturing of the active matrix circuitry of an active matrix OLED display device which results in non-functional pixels or pixels which emit at an incorrect luminance level (dim or bright). Alternately, defects in the active matrix circuitry can result in a condition where a pixel continuously emits during operation and can not be selectively turned off. This is type of defective pixel is referred to as a stuck-on pixel.

Many of these manufacturing defects, typically occur with an area density that depends on the capability of the manufacturing process, equipment and the environment. However, the total yield with respect to non-emitting pixels depends on the area density of the defects and the area of the individual displays. Larger display devices, such as those useful for televisions, computer monitors, or laptops, will have lower yields than smaller substrates given the same defect density.

In a multicolored device, a dead, dim, bright, or stuck-on pixel in one color can cause color distortions in the image. That is, multiple different color pixels such as the red pixel and the green pixel, for example, can be simultaneously illuminated in a predetermined luminance ratio so that the viewer perceives a desired color, such as yellow. With this example, if one of the pixels, such as the green pixel, is dead or dim, the resulting image will not appear the desired yellow color in the area of the defective pixel but will instead appear to be more red in color.

SUMMARY OF THE INVENTION

It is therefore an object of the present invention to provide a method of making an OLED display device with an array of color filter elements that can display a high quality image even when one or more of the light producing elements are defective pixels.

This object is achieved by a method of making an OLED display device for producing an image comprising:

a) forming an array of light producing elements;

b) testing the array of light producing elements and recording the location of defective light producing element(s);

c) providing a default pattern of the array of color filter elements having at least two different colors; and d) forming an array of color filter elements in response to the recorded location of the defective light producing element(s), the location of at least one color filter element being changed from the default pattern.

The present invention provides an effect way to compensate for defective light producing elements in an OLED display device having color filter elements. A high quality image can be produced without color distortions. The presents provides a method for reducing rejected OLED display devices thereby reducing overall manufacturing cost.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "multicolor" is employed to describe a display device that is capable of emitting light of different hues in different areas. In particular, it is employed to describe a display panel that is capable of displaying images of different colors. The term "full color" is commonly employed to describe multicolor display panels that are capable of emitting in at least the red, green, and blue regions of the visible spectrum and displaying images in any combination of hues. The red, green, and blue colors constitute the three primary colors from which all other colors can be generated by appropriate mixing. However, the use of additional colors to extend the color gamut of the device is possible. The term "pixel" is employed in its art-recognized usage to designate an area of a display panel that can be stimulated to emit light independently of other areas. It is recognized that in full-color systems, several pixels of different colors will be used together to generate a broad range of colors. For the purposes of this specification, such a group will be considered several different colored pixels.

Figure 4A:
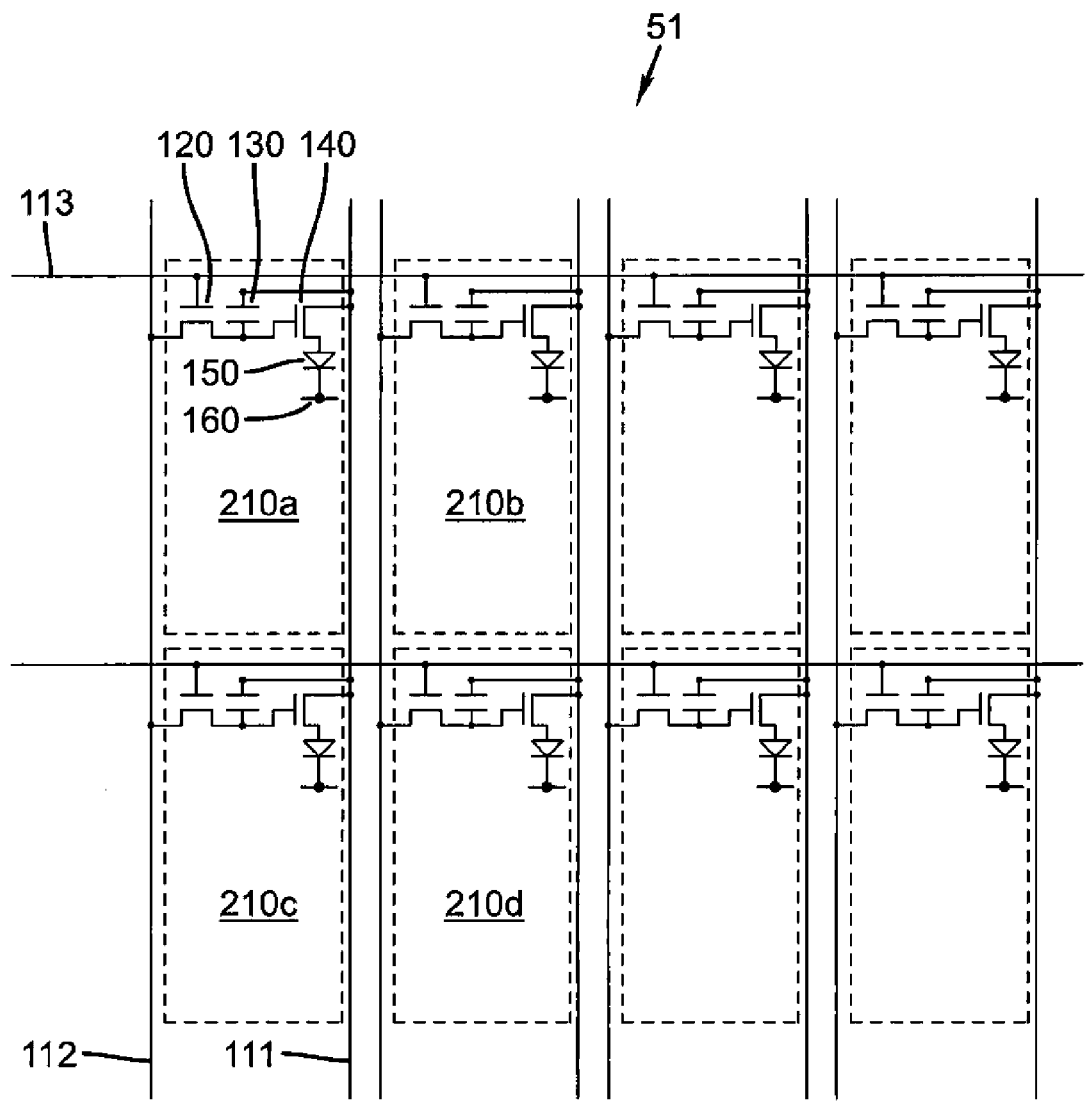
FIG. 4a shows a schematic layout diagram for an array of light producing elements having active matrix circuitry for a prior art OLED display device.
Figure 4B:
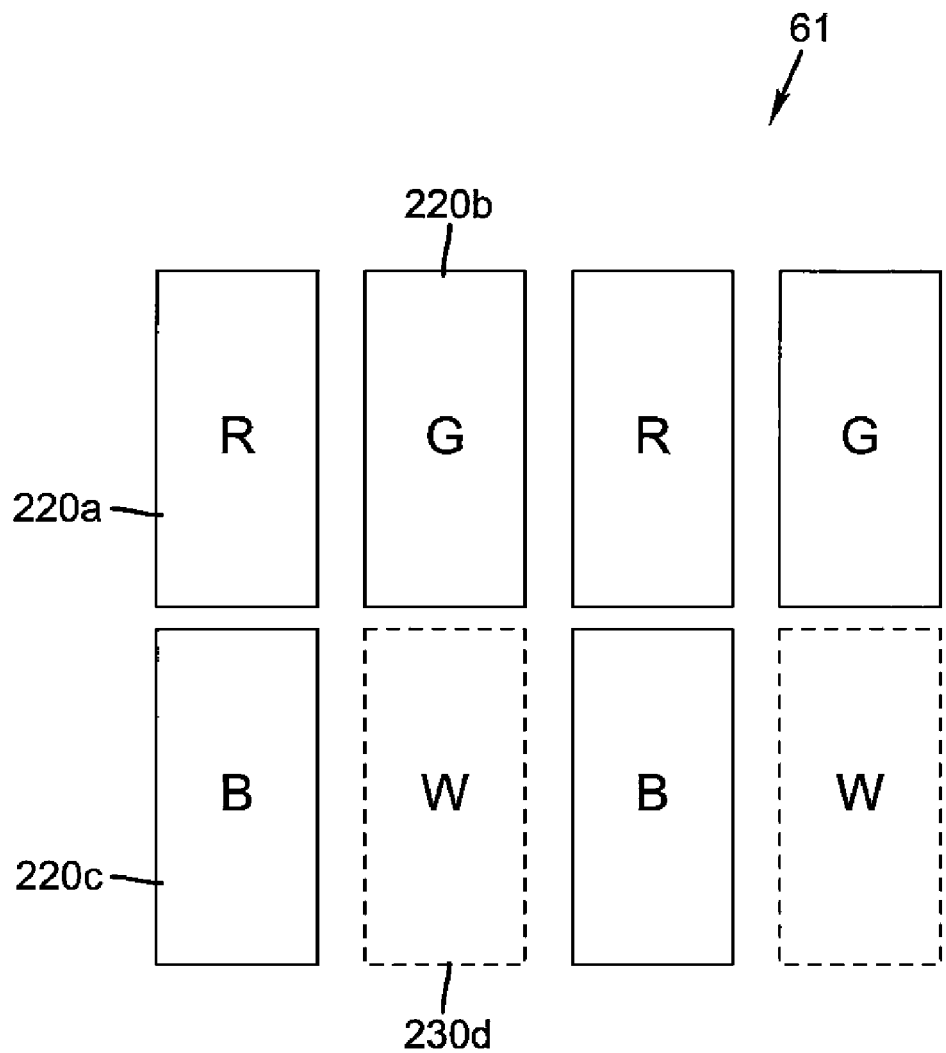
FIG. 4b shows an array of color filter elements for a prior art OLED display device.

In order to more fully appreciate the invention, aspects of a prior art OLED display device will be described with reference to FIGS. 4a and 4b. A schematic layout diagram of an array of light producing elements 51 having active matrix circuitry of the prior art display device is shown in FIG. 4a. This includes light producing elements 210a, 210b, 210c, and 210d. A total of eight light producing elements arranged in four columns and two rows is shown for illustrative purposes, however, a typical display will commonly have many more rows and columns. A corresponding array of color filter elements 61 is shown in FIG. 4b. This includes color filter elements 220a, 220b, and 220c. The color filter elements are spaced to leave unfiltered spaces, such as unfiltered space 230d. This prior art display device is formed by aligning attaching the array of light producing elements 51 to the array of the color filter elements 61. In this case, color filter element 220a is aligned to light producing element 210a, color filter element 220b is aligned to light producing element 210b, and color filter element 220c is aligned to light producing element 210c which form colored pixels which are red (R), green (G), and blue (B) respectively. Similarly, unfiltered space 230d is aligned to light producing element 210d forming a white (W) pixel. The pixels are arranged in a two by two pattern known as a quad pattern. This pattern is repeated across the display area. A variety of other pixel patterns are known in the art. Some examples of such alternate patterns are shown in U.S. Pat. No. 6,919,681.

The example prior art display is electrically driven by active matrix circuitry, as shown in FIG. 4b. This active matrix circuitry includes several signal lines such as a select line 113, a power line 111, and a data line 112. Each light producing elements, such as light producing element 210a, includes several components such as an organic light emitting diode 150, and an active matrix components such as a select transistor 120, a storage capacitor 130, and a drive transistor 140. A common upper electrode 160 is applied to all the organic light emitting diodes to complete the circuit.

This active matrix drive circuitry operates in a manner well known in the art. Each row of light producing elements is selected in turn by applying a voltage signal to the select line associated with the row, such as select line 113, which turns on the select transistor, such as select transistor 120, associated with each light producing element in that row. The brightness level, or gray scale information, for each light producing element is controlled by a voltage signal, which is set on the data lines, such as data line 112. The storage capacitor, such as storage capacitor 130, for each light producing element is then charged to the voltage level of the data line associated with that pixel and maintains the data voltage until the row is selected again during the next image frame. The storage capacitor 130 is connected to the gate terminal of the power transistor 140. Power transistor 140 regulates the current flow through its source and drain terminals from the power line 111 to the organic light-emitting diode 150 in response to the voltage level held on its gate terminal by storage capacitor 130, thereby controlling the pixel's brightness. Organic light-emitting diode is supplied power from power line 111 which is connected to a first voltage source through power transistor 140 and out the common upper electrode 160 connected to a second voltage source. Each row is then unselected by applying a voltage signal to the select line, which turns off the select transistors. The data line signal values are then set to the levels desired for the next row and the select line of the next row is turned on. This is repeated for every row of pixels. During this time, storage capacitor 130 maintains the data signal on the gate of power transistor 140 such that organic light emitting diode 150 continues to emit while the other rows are receiving data.

This two transistor, one capacitor (2T1C) circuit arrangement is commonly used in the art and can be used in practicing the present invention. Many different alternate types of circuit arrangements are also known in the art. The present invention can be practiced using these alternate types of circuit arrangements. These alternate arrangements include, for example, current mirror type circuits such as shown in U.S. Pat. Nos. 6,091,203, 6,501,466, 6,535,185 and 6,774,877 as well as the pixel circuits shown in U.S. Pat. No. 6,229,506 and the pixel circuit described in U.S. Patent Application Publication 2004/0222746 A1. The circuit of FIG. 4a is shown with the organic light-emitting diode arranged in a particular bias with the cathode connected to the common electrode connection and the anode connected to the power transistor. Other circuits where the organic light emitting diodes have the opposite polarity arrangement can also be used. Also, although the capacitor is shown connected to the power line, other example circuit arrangements where a separate capacitor signal line is provided can be used.

Figure 5A:
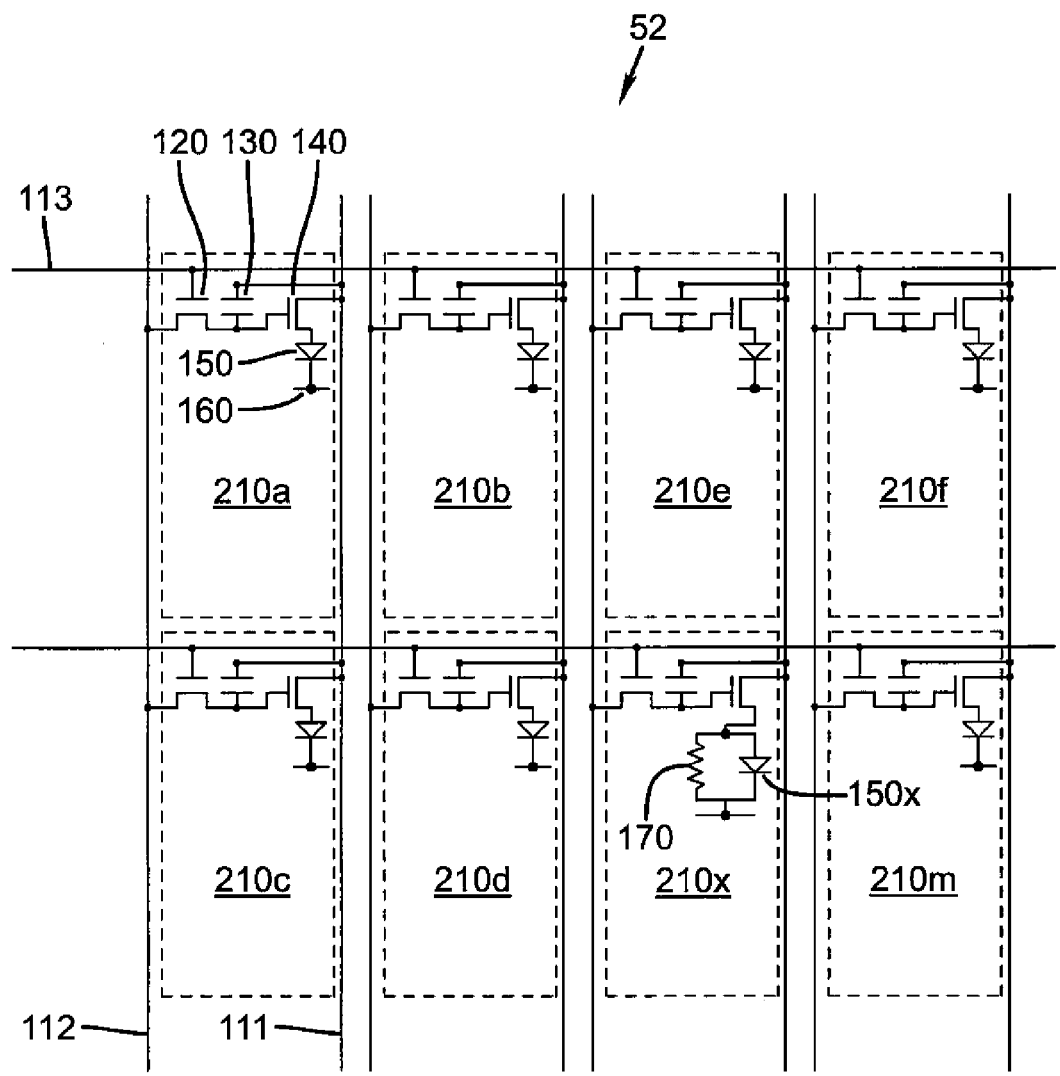
FIG. 5a shows a schematic layout diagram for array of light producing elements having active matrix circuitry according to a first embodiment of the present invention where one of the light producing elements is defective.

Turning now to FIG. 5a, an OLED display device according to a first embodiment of the present invention is shown having an array of light producing elements 52 including a defective light producing element 210x. In this case, a short-circuit defect 170 is present connecting the anode and cathode of organic light emitting diode 150x. Short circuit defect 170 is represented by a resistor having a resistance ranging from approximately 100 Kohms to nearly 0 ohms. This short circuit defect 170 could be caused, for example, by a particle defect of a scratch defect in the organic electroluminescent media in the organic light emitting diode 150x. Short circuit defect 170 is an example defect to which the present invention could be applied. The present invention can also be applied to other types of defects, including defective transistors and opens and shorts in the transistors and the wires connecting the transistors. Defective transistors include transistors with abnormal characteristics such as threshold voltage or mobility due to fabrication process problems or variability.

Figure 5B:
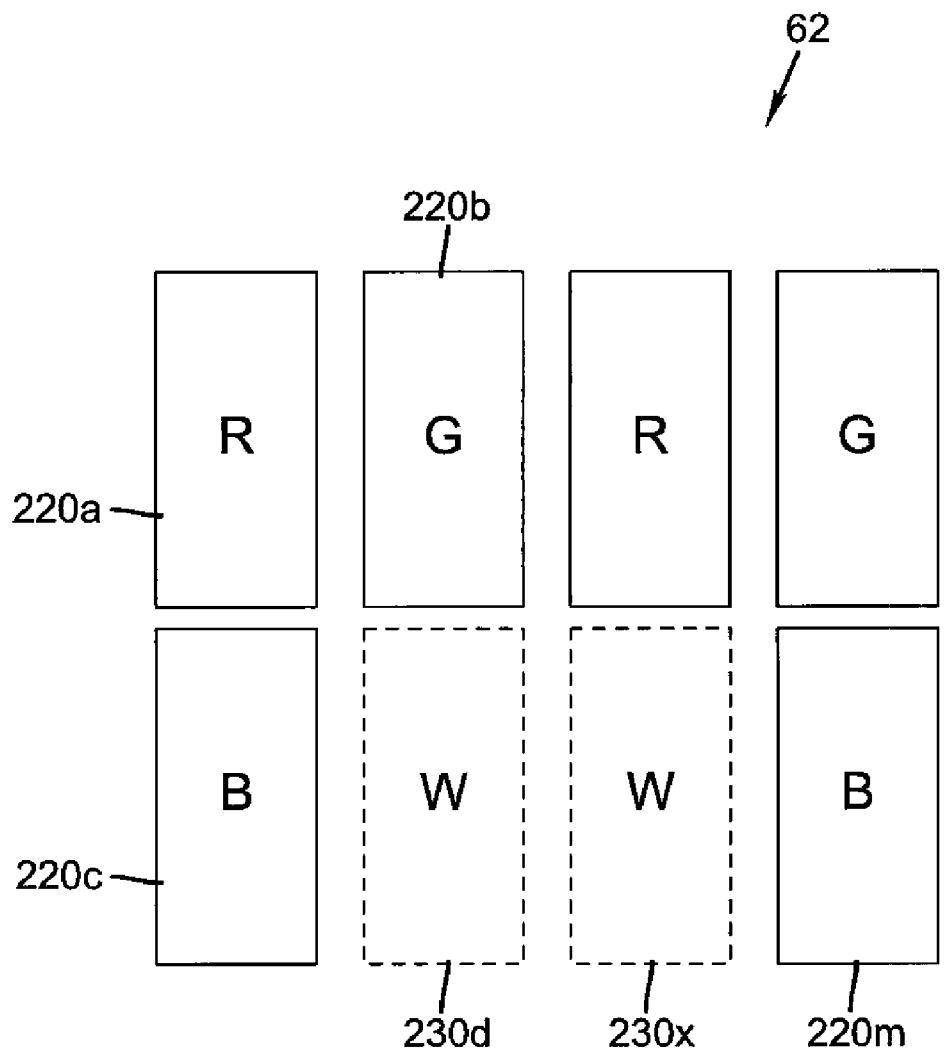
FIG. 5b shows an array of color filter elements where the location of the color filter elements has been adjusted according to the first embodiment of the present invention.

FIG. 5b illustrates an array of color filter elements 62 according to the first embodiment of the present invention, corresponding to the array of light producing elements shown in FIG. 5a. The array of color filter elements includes a default pattern of Red (R), Green (G), Blue (B) color filter elements shown as color filter elements 220a, 220b, and 220c respectively. Unfiltered space 230d is provided to provide a white (W) pixel. This default pattern is the same as the prior art device shown in FIG. 4b. The color filter element pattern, however, has been adjusted according to the present invention to compensate for the presence of defective light producing element 210x. In this case, defective light emitting element 210x would have normally been intended to be a blue pixel according to the default pattern. In order to compensate for the presence of defective light producing element 210x, the position of color filter element 220m, which is Blue (B), has been adjusted to instead correspond to light producing element 210m. In this case, unfiltered space 230x has been also been adjusted to correspond to defective light producing element 210x. The resulting OLED display device is then programmed to utilize light producing elements 210e, 210f, and 210m to generate full color images with red, green, and blue light without using defective light producing element 210x as will be described in more detail below. Therefore, the effect of the defective light producing element 210x is reduced and the good image quality achieved.

Figure 6:
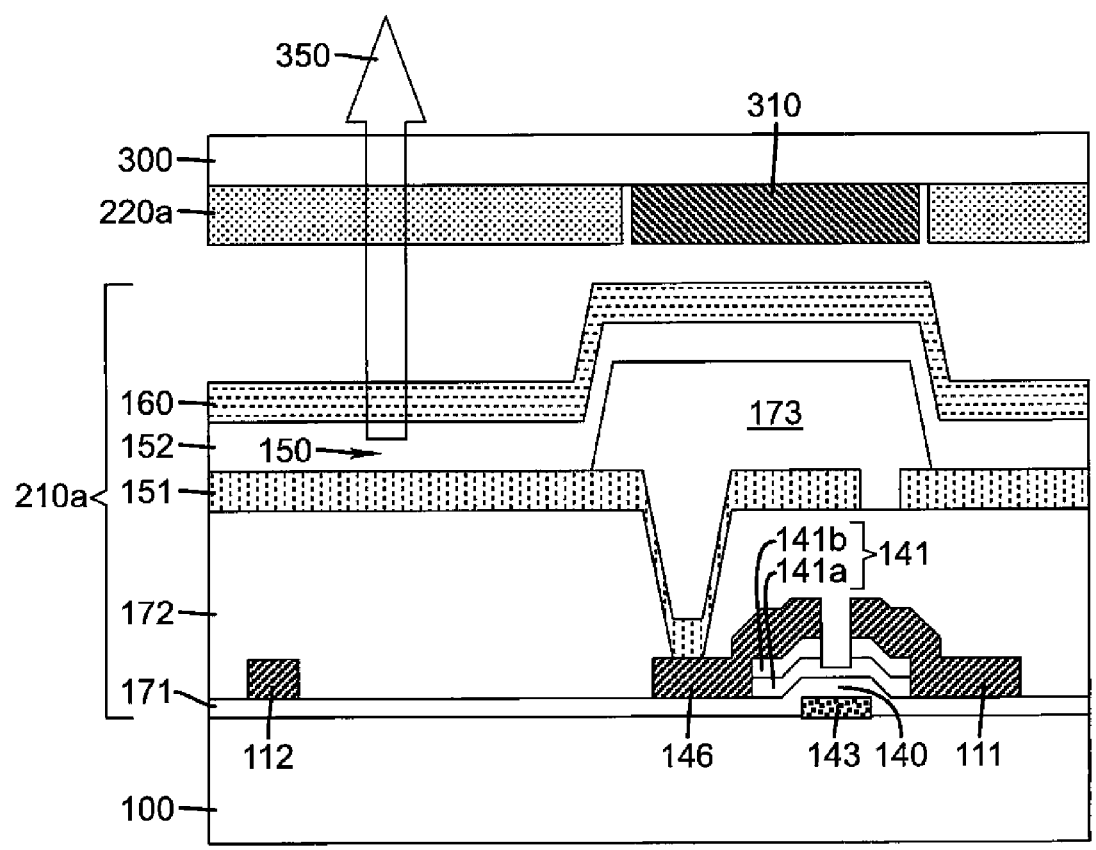
FIG. 6 shows a cross sectional view of an OLED display device according to the first embodiment of the present invention.

FIG. 6 illustrates a cross sectional view of a section of the assembled OLED display device according to the first embodiment of the present invention. In FIG. 6, the construction of light producing element 210a can be seen. Light producing element is formed on a first substrate 100. First substrate 100 can be chosen from a variety of known substrate types commonly used in the art include glass, plastic, metal foils, silicon wafers, and the like. The construction of drive transistor 140 can be seen, including a semiconductor layer 141, a gate terminal 143, and a terminal 146. Terminal 146 functions as either the source or drain terminal of the drive transistor 140. Power line 111 serves as the third terminal of the transistor. The semiconductor layer 141 is shown as being constructed of amorphous silicon having an undoped sub-layer 141a and a doped sub-layer 141b. Other semiconductor materials known in the art, including polysilicon, can also be applied to the present invention by one skilled in the art. Drive transistor 140 is shown as having a bottom gate configuration, however, other known configurations including top gate or dual gate configurations known in the art can be applied to the present invention by one skilled in the art. Formation of these thin film transistor structures is well known in the art using conventional deposition, patterning, and etch processes.

A gate insulator layer 171 and an inter-layer insulator layer 172 are formed so as to provide electrical isolation between the various signal lines. A preferred material for these insulator layers is silicon nitride. A lower electrode 151 is provided and is electrically connected to power transistor 140. Lower electrode 151 serves as the first electrode for organic light emitting diode 150. Common upper electrode 160 serves as the second electrode for organic light emitting diode 150. Lower electrode 151 can be reflective and can include materials such as Aluminum, Silver, Molybdenum, and the like with a thickness of approximately 100 to 400 nm. Lower electrode 151 can also be constructed of several sub-layers with one sub-layer including the above reflective materials as well as sub-layers of transparent materials such as Indium Tin Oxide (ITO), Indium Zinc Oxide (IZO) and the like. These materials can be deposited by several methods known in the art including sputtering and can be patterned by known lithography and etch techniques. Some examples of useful constructions of lower electrode 151 are provided in U.S. Pat. No. 6,737,800. Above lower electrode 151, an inter-pixel insulator layer 173, such as is described in U.S. Pat. No.

6,246,179, is preferably used to cover the edges of the lower electrode 151 in order to prevent shorts or strong electric fields in this area. While use of the inter-pixel insulator layer 173 is preferred, it is not required for successful implementation of the present invention.

Organic electroluminescent media 152 is formed between lower electrode 151 and common upper electrode 160. While organic electroluminescent media 152 is shown as a single layer, it will be understood by one skilled in the art that this layer is typically comprised of a plurality of sub-layers including, for example, a hole injecting sub-layer, a hole transporting sub-layer, an emitting sub-layer, and an electron transporting sub-layer. There are numerous configurations of the organic electroluminescent media 152 wherein the present invention can be successfully practiced. For the organic electroluminescent media 152, a common broadband (or white) light source which emits light at all the various wavelengths used by all the differently colored pixels is preferably used to avoid the need for patterning the organic electroluminescent media between light producing units. Colored pixels are achieved by aligning color filter elements with light producing elements. Pixels that are to emit white or broadband emission are formed by coupling a light producing unit, such as light producing unit 210d, with an unfiltered space, such as unfiltered space 230d. Some examples of organic EL media layers that emit broadband or white light are described, for example, in U.S. Pat. No. 6,696,177. However, the present invention can also be made to work where each pixel has one or more of the organic electroluminescent media sub-layers separately patterned for each pixel. Alternate constructions of the organic electroluminescent media 152 having fewer or more sub-layers can also be used to successfully practice the present invention. The organic electroluminescent media 152 includes organic materials which are either small molecule materials or polymer materials as is known in the art. These organic electroluminescent media layers can be deposited by several methods known in the art such as, for example, thermal evaporation in a vacuum chamber, laser transfer from a donor substrate, or deposition from a solvent by use of a spin coating or ink jet print apparatus. The organic electroluminescent media 152 has a preferable thickness range of approximately 50 to 400 nm. When electrically stimulated, electroluminescent media 152, will produce light emission 350.

Upper electrode 160 is formed over the organic electroluminescent media 152. Upper electrode 160 is transparent or semi-transparent. Useful materials for upper electrode 160 include semitransparent thin metallic layers such as aluminum or silver deposited to thickness of preferably less than 25 nm or transparent materials such as Indium Tin Oxide (ITO) or the like.

In this embodiment, color filter element 220a is formed on a second substrate 300 as shown in FIG. 6. Second substrate 300 is preferably highly transparent and constructed of known materials such as glass or transparent plastics. A wide variety of colored materials are known in the art for use as color filter elements. One common method of forming color filter elements is to coat a dyed or pigmented solution onto the substrate and pattern the solution using photolithographic methods. While this photolithography approach can be utilized in practicing the present invention, more preferable approaches include transferring a color filter material from a donor sheet using a thermal element or laser element. Examples of techniques and materials for transferring color filter elements from a donor sheet can be found in U.S. Pat. Nos. 4,965,242 and 5,521,035. Another preferable approach includes depositing the color filter elements from a solution using an inkjet printing device. Examples of techniques and materials for depositing the color filter elements by ink jet methods can be found in U.S. Pat. No. 6,743,556. These approaches are particularly preferable as the locations of the color filter elements can be easily changed by adjusting the printing or imaging patterns electronically before writing (as described in more detail below). Photolithographic patterning, on the other hand, typically requires a photo-mask to be fabricated in order to form a new pattern and creating a plurality of masks results in higher manufacturing costs. Alternately, a photo-mask could be created imaging only a single pixel or a small number of pixels and then stepped (repeated) across the substrate, however, this would require considerable processing time resulting in low manufacturing throughput. Therefore, more preferable deposition processes are 'mask-less' processes such as the ink jet printing or thermal transfer processes described above where the pattern can be adjusted electronically before processing each device.

A black matrix 310 is formed over substrate 200 between the color filter elements. Black matrix 310 is an opaque, absorbing film formed between the emitting area of the pixels to absorb any undesired reflective light, thereby improving image contrast. Black matrix 310 can also aid in the patterning or alignment of the color filter elements. For example, the black matrix can serve to contain ink jetted droplets used in producing the color filter element. Alternately, additional wall layers known in the art could be utilized to perform this function. Use of a black matrix is optional and, while preferred, is not required for successful practice of the present invention.

Figure 1:
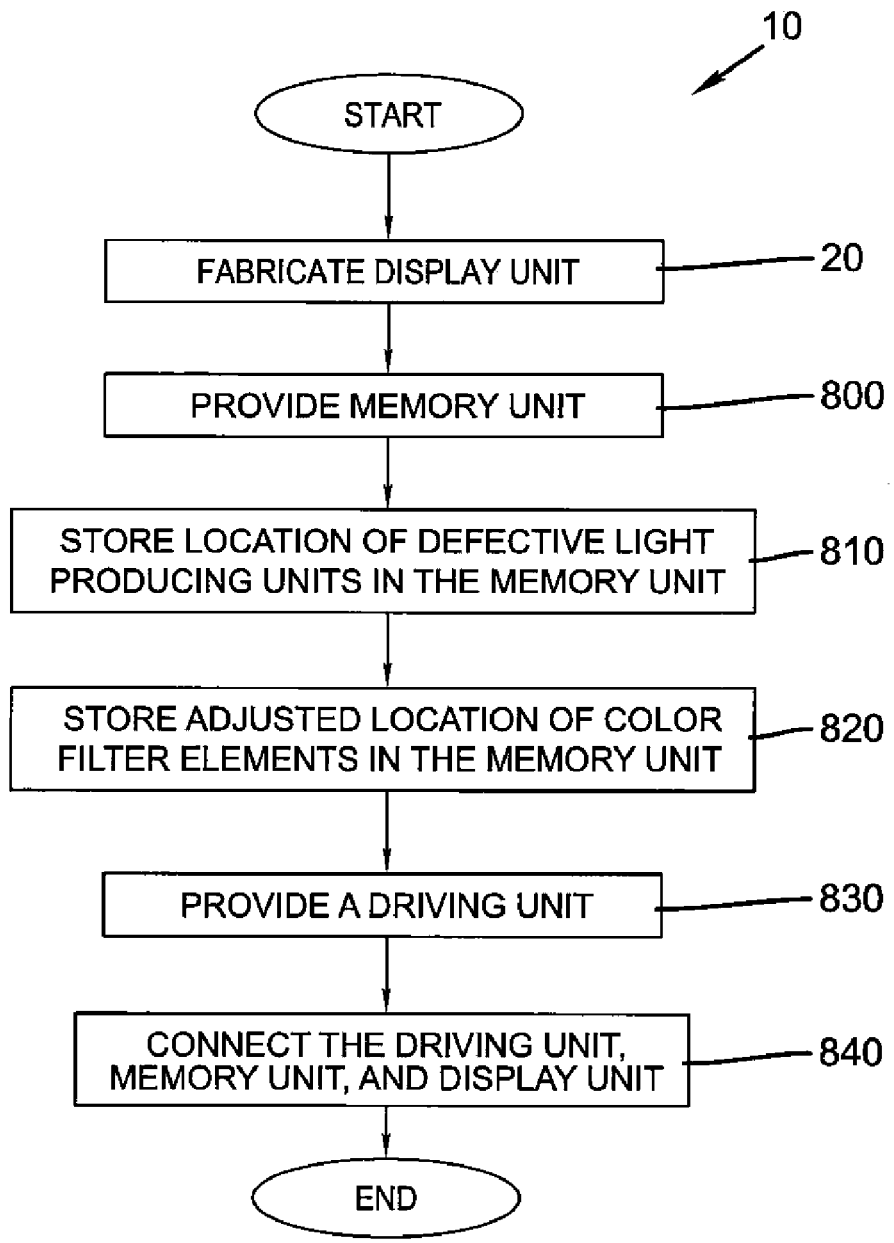
FIG. 1 is a block diagram showing one embodiment of a method for fabricating an OLED display device in accordance with this invention.
Figure 2:
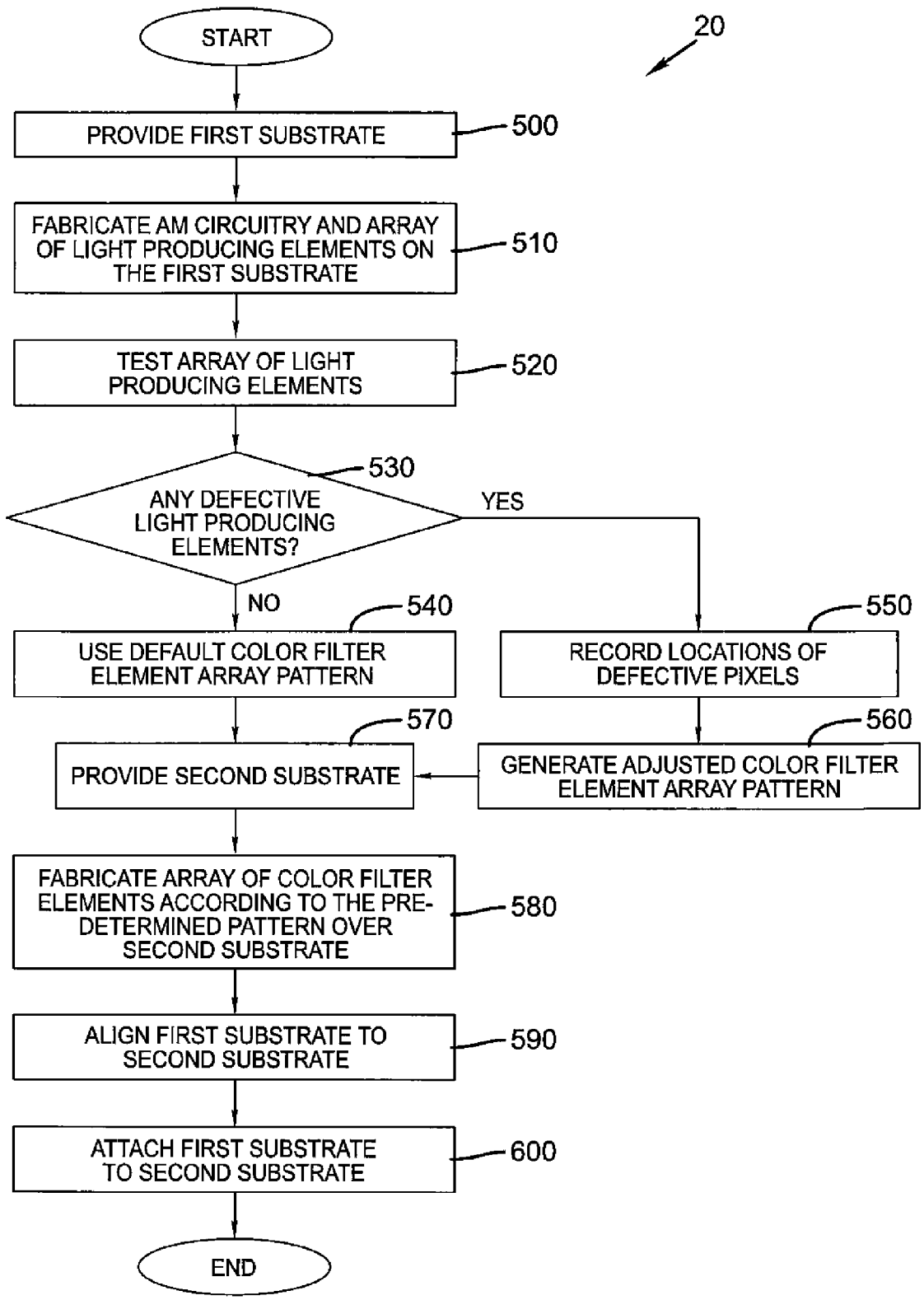
FIG. 2 is a block diagram showing a method for fabricating an OLED display unit of an OLED display device of FIG. 1 in greater detail.
Figure 3:
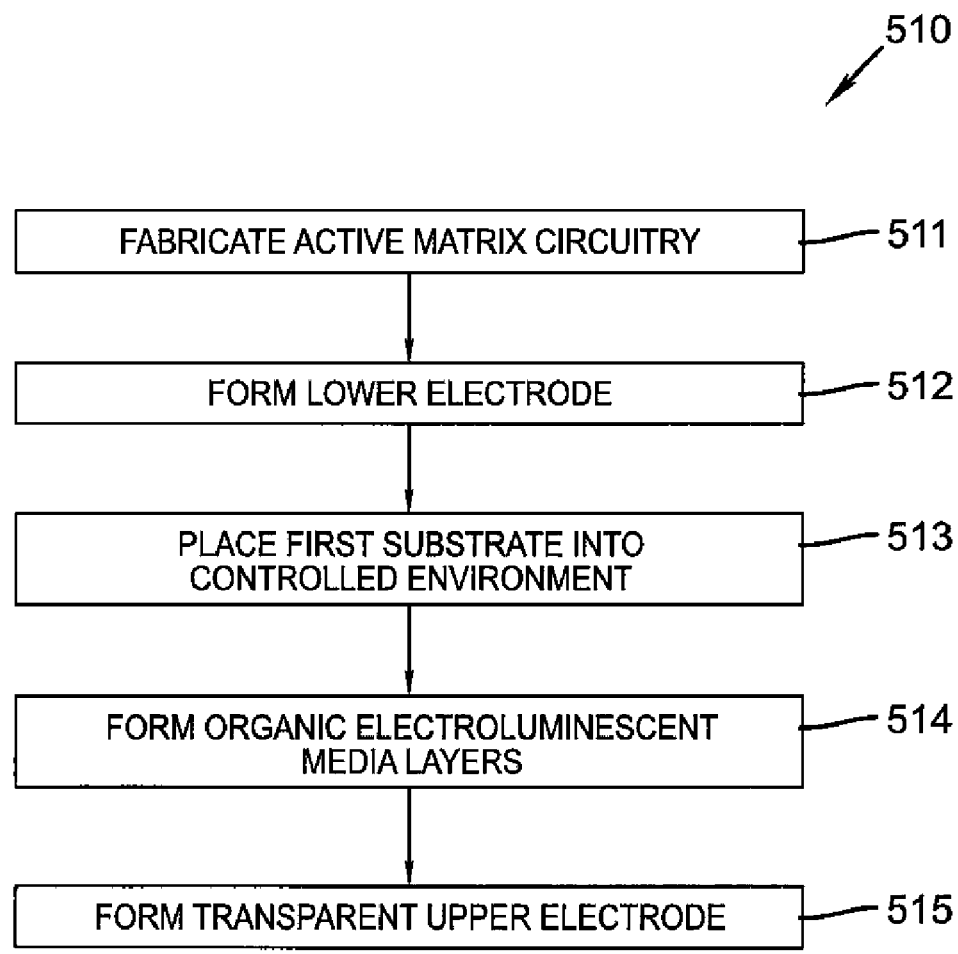
FIG. 3 is a block diagram showing a portion of the embodiment of FIG. 2 is greater detail.

Turning now to FIGS. 1, 2 and 3 and also with reference to the OLED display device shown in FIG. 5a, 5b, and 6, the fabrication method for an OLED display device according to the present invention will be described. Starting with FIG. 1, a block diagram of a fabrication process 10 for fabricating a display device according to the present invention. Fabrication process 10 begins with fabricating a display unit (fabrication process 20). A display unit includes an array of light producing elements coupled with an array of color filter elements. The fabrication process (fabrication process 20) for fabricating a display unit is shown in greater detail as a block diagram in FIG. 2.

As shown in FIG. 2, the fabrication process for fabricating a display unit (fabrication process 20) begins by providing a first substrate 100 (step 500). First substrate 100 can be chosen from a variety of known substrate types commonly used in the art include glass, plastic, metal foils, silicon wafers, and the like. Active matrix circuitry and an array of light producing elements are then formed over substrate 100 in step 510. The details of step 510 are further described in greater detail in FIG. 3.

That is, as shown in FIG. 3, first the active matrix circuitry is formed in step 511 over first substrate 100. Fabrication of active matrix circuitry is well known in the art. The active matrix circuitry can be selected from a variety of known types including amorphous silicon and polysilicon types and can have a wide variety of circuit configurations as previously described. Lower electrode 151 is then formed in step 512. As previously described, lower electrode 151 can be reflective and can include materials such as Aluminum, Silver, Molybdenum, and the like with a thickness of approximately 100 to 400 nm. Lower electrode 151 can also be constructed of several sub-layers, such as a reflective sub-layer formed of the above reflective materials as well as transparent sub-layers formed of materials such as Indium Tin Oxide (ITO), Indium Zinc Oxide (IZO) and the like. The lower electrode 151 is deposited as a layer over the substrate and active matrix circuitry by methods known in the art such as sputter deposition. The lower electrode 151 is then patterned using well known photolithography and wet or plasma etching methods. After lower electrode 151 is formed, inter-pixel insulator layer 173 can be optionally provided as previously described. The first substrate 100 is then placed into a controlled environment in step 513. The controlled environment is an environment that contains an inert ambient gas such as nitrogen, argon, or like or an environment that is maintained at a reduced pressure (vacuum) such as less than 133 Pa and preferably less than 0.133 Pa and more preferably less than 0.133 mPa. The controlled environment can be a dry box, vacuum chamber, or a plurality of dry boxes and/or vacuum chambers either directly connected or linked by means of transfer vessel. The preferred controlled environment is a sealed vacuum vessel cluster system or and in-line vacuum vessel system. This controlled environment is beneficial to the subsequent deposition of the organic electroluminescent media materials, which are known to degrade in the presence of moisture and oxygen. While in the controlled environment, the organic electroluminescent media 152 is formed over the lower electrode 151 in step 514. As previously described, the electroluminescent media 152 is preferably constructed of a plurality of sub-layers have a plurality of different organic materials known in the art. One preferred method for depositing these organic electroluminescent media materials is by heating a plurality of sources, such as graphite boats, containing the materials such that the material evaporates or sublimates and condenses over the lower electrode 151 and first substrate 100. The organic electroluminescent media materials are preferably deposited through a shadow mask so as to be formed only over the light producing elements and not the peripheral areas of substrate 100 which can be used for making external electrical connections. Alternate methods of depositing the organic electroluminescent media materials include laser transfer from a donor substrate and deposition from a solvent by use of a spin coating or ink jet print apparatus. Next, upper electrode 160 is formed in step 515. The upper electrode 160 is preferably transparent or semi-transparent as previously described. A semi-transparent upper electrode can be formed by depositing a thin (25 nm or less) layer of metal such as aluminum or silver by known methods such as evaporation or sputtering. A transparent upper electrode can be formed by depositing a layer of a highly transparent conductive material such as Indium Tin Oxide (ITO) by known methods such as sputtering with a preferable thickness of approximately 50 to 400 nm. The upper electrode materials are preferably deposited through a shadow mask so as to be formed only over the light producing elements and not the peripheral areas of substrate 100 since the peripheral areas are used for making external electrical connections.

Returning to FIG. 2, the next step for forming the display unit in fabrication process 20 after the forming the active matrix circuitry and array of light producing elements (step 510) is to test the array light producing elements (step 520). One preferred type of testing involves sensing the light emission of the array of light producing elements. This involves applying electrical power to the light producing elements, for example, by way of the active matrix circuitry. The light producing elements can be illuminated individually or all the light producing elements can be illuminated simultaneously. A photo-detector, photo-diode, radiometer, CCD camera array or the like can be used to sense the light output of the light producing elements. During the testing, the light producing elements can be illuminated to a single luminance intensity or to a range of luminance intensities corresponding to the desired range of intensities needed for the final OLED display device. Since the organic electroluminescent media materials are sensitive to moisture and oxygen, as previously described, step 520 is preferably conducted within the controlled environment such that the array of light producing elements is not substantially exposed to oxygen or moisture between the time when the organic electroluminescent media and the upper electrode are formed (steps 512 and 513) and the time the testing occurs (step 520). Alternately, a thin film encapsulation formation step can be performed (not shown) prior to testing (step 520) to seal the array of light producing elements from environmental oxygen or moisture. Such thin film encapsulation layers are known in the art and include layers of Aluminum Oxide deposited by an atomic layer deposition (ALD) method followed by a Parylene layer as described in U.S. Patent Applications US 2001/0052752 A1 and US 2002/0003403 A1. In this case where a thin film encapsulation is present, the array of light producing elements can safely be removed from the vacuum environment for the test such that the equipment used for providing electrical power and for measuring light output no longer need to be at least partially contained or interfaced to the controlled environment and thereby said testing equipment can be simplified.

During the testing process (step 520), the light producing elements are examined to determine if any light producing elements are defective. Defective light producing elements can include light producing elements that produce abnormal brightness, such as light producing elements that are dim or overly bright. If such defective light producing elements were utilized in pixels of the final OLED display device, these pixels would be defective dim pixels or defective bright pixels respectively. Defective light producing elements can also include light producing elements that are incapable of producing light when electrically stimulated. If such defective light producing elements were utilized in pixels of the final OLED display device, these pixels would be defective dead pixels. Defective light producing elements can also include light producing elements that produce light when electrically powered but not specifically addressed. If such defective light producing elements were utilized in pixels of the final OLED display device, these pixels would be defective stuck-on pixels. Defective light producing elements can also include light producing elements that have an emission spectrum that is different than the desired emission spectrum. If such defective light producing elements were utilized in pixels of the final OLED display device, these pixels would produce an incorrect color. Other defect types of light producing elements can also be inspected for during the testing process (step 520).

Optionally, certain defective light producing units can be modified to change the nature of the defect. For example, stuck-on pixel defects might be found where a defective light producing unit produces light even though it is not specifically addressed. Such defective light producing elements can be converted to non-emitting light producing elements by methods such as laser cutting of signal electrical connections. For example, a laser can be used to cut the electrical wiring connecting the drive transistor to the power supply line or the electrical wiring drive transistor to the lower electrode.

Following testing the array of light producing elements (step 520), it must be decided (decision block 530) whether any defective light producing elements are present or present in sufficient high quantity as to result in an unacceptable display quantity. If no defective light producing elements are found or are only present in an acceptably low quantity, then a default color filter array pattern can be used (step 540). A default color filter pattern can be one in which the differently colored color filter elements are arranged in a regular, repeating pattern such as shown in FIG. 4b. Alternately, the default color filter pattern can be a pre-determined, random arrangement of the differently colored color filter elements. For example, every group of four differently colored pixels (R, G, B, and W) can be randomly selected. A random pattern is beneficial to the present invention so that, as will be explained below, if a color filter element's position is adjusted, a viewer of the display device will not be able to visually detect a variation in a pixel pattern. In this embodiment, the color filter array pattern is then implemented by providing a second substrate (step 570) and fabricating the color filter elements on the second substrate according to the selected pattern (step 580), which in this case is the default filter pattern.

If, per decision block 530, one or more defective light producing elements are present, then the locations of the defective light producing elements are recorded (step 550). The location consists of the placement of the light producing element within the array of light producing elements. For example, this location information can include the number of the light producing element's row and column. Alternately, the location information can consist of a single number uniquely identifying the light producing element, such as a number counting from the first light producing element in the first row and first column. Other location systems can also alternately be employed, such as a physical measurement of the position of the light producing element relative to the edge of the array of light producing elements or the substrate. The location information is recorded, preferably electronically, by storing the information, for example on a computer or computer network. The location information is also coupled with information regarding the identification of the first substrate or array of light producing elements such as a 'plate number' or serial number. This substrate identification information facilitates fabrication of a large number of devices simultaneously allowing for the location information to be later associated with the substrate even if substrates are moved or placed in storage prior to completion of the full display device fabrication process.

Using the location information recorded in step 550, the default color filter pattern is adjusted in step 560. For example, as shown in FIGS. 5A and 5B, defective light producing element 210x would be identified as defective while testing the array of light producing elements 52 during step 520. According the default color filter pattern (such as the prior art pattern of FIG. 4B), defective light producing element 210x would have conventionally been coupled with a blue color filter had it not been defective. Since, however, defective light producing element 210x is defective, this coupling would have resulted in a display device which was unable to produce blue color emission in the near the location of defective light producing element 210x. So, according to the present invention, the location of color filter element 220m, which is blue, is changed to instead be located over light producing element 210m, which would have otherwise been used to form a white pixel. In this case, the location of unfiltered space 230x is similarly changed to be over defective light producing element 210x. By changing the locations of color filter element 220m and light producing element 210x, an adjusted color filter pattern is created. In this embodiment, the color filter array pattern is then implemented by providing a second substrate (step 570) and fabricating the color filter elements on the second substrate according to the selected pattern (step 580), which in this case is the adjusted pattern.

Figure 7:
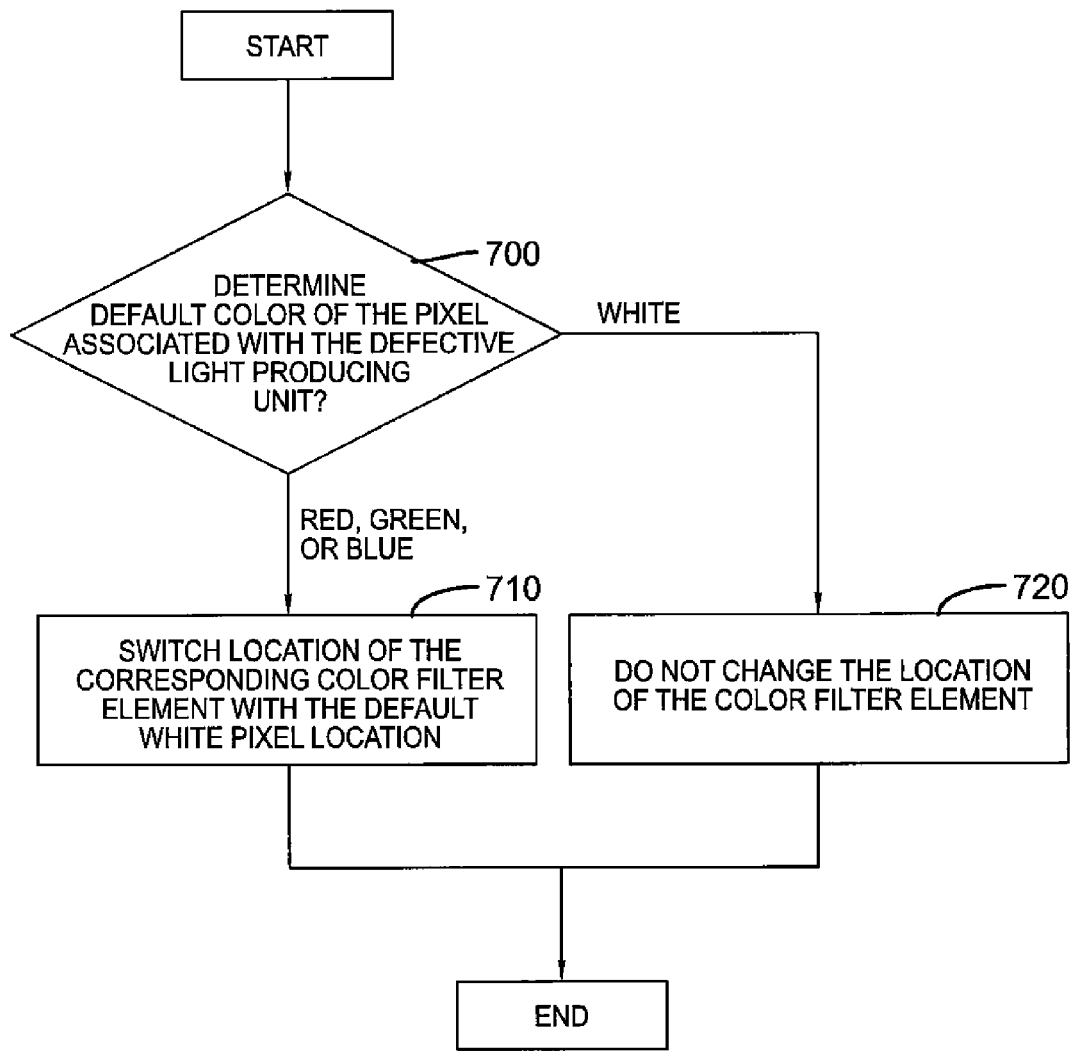
FIG. 7 is a block diagram showing a logic algorithm for adjusting the position of the color filter elements according to the first embodiment of the present invention.

It is preferred, according to the first embodiment of the present invention, to change the positions of the color filter elements and unfiltered spaces such that the defective light producing elements are coupled with unfiltered spaces. As a result, the region of the display around defective light producing element will be lacking a functional white colored pixel. However, the resulting display device will still be able to reproduce full color images as the red, green, and blue pixels will be functional. White colors and shades of gray can still be produced by combinations of the functional red, green, and blue pixels. If a defective light producing element is located such that it would have been coupled to a unfiltered space to form a white pixel according to the default pattern, then it is preferred to not adjust its position so that it remains coupled to the unfiltered space. This simple logic algorithm is described in FIG. 7. That is, a determination is first made as to what is the default color of the pixel associated with the defective light producing element according to the default pattern (decision block 700). If the default color pixel is white, then no adjustment to the pattern of the array of color filter elements is made (step 720). If the default color pixel is red, green, or blue, then the pattern of the array of color filter elements is changed by switching the positions of the white pixel and predetermined color pixel (step 710). More complicated logic algorithms can also be implemented wherein multiple defective light producing elements in close proximity are compensated for by adjusting the location of their default corresponding color filter elements to be over alternate, functional light producing elements. Other alternate logic algorithms where the defective pixel is chosen to be a color other than white can also be implemented and are within the scope of the present invention. For example, the present invention can be applied to display devices having only red, green, and blue (RGB) pixels and where the locations color filter elements are adjusted to so that a plurality of defective pixels are evenly distributed between the different colors. That is, a display is made using this alternate logic algorithm to have one defective red, one defective blue, and one defective green pixel instead of three defective blue pixels had adjustments to the locations of the color filter elements not been made.

Returning to FIG. 2, the array of color filter elements is fabricated over the second substrate (step 580), as described above, according to the pattern that is predetermined to be either the default filter pattern (in step 540) or an adjusted filter pattern (in step 560). Several methods can be used to fabricate the array of color filter elements. Preferable methods for fabricating the array of color filter elements are those wherein the pattern can be adjusted electronically. These include deposition from an ink jet nozzle or array of ink jet nozzles or transferring of color filter materials from a donor sheet such as by a thermal, including laser, head. Examples of techniques and materials for depositing the color filter elements by ink jet methods can be found in U.S. Pat. No. 6,743,556. Examples of techniques and materials for transferring color filter elements from a donor sheet can be found in U.S. Pat. Nos. 4,965,242 and 5,521,035.

After fabricating the color filter array, the first substrate and the second substrate are precisely aligned (step 590) so as to overlay the color filter elements to the light producing elements. Since alignment can not be perfect, the color filter elements are preferably made so as to be slightly larger than the light producing elements, thereby providing tolerance for some amount of misalignment. The second substrate is then attached to the first substrate (step 600). This is achieved, for example, by dispensing an adhesive which is preferably highly impermeable to moisture and air between the first and second substrates and curing the adhesive, such as by ultraviolet (UV) radiation exposure. This forms a sealed region. Optionally, additional desiccating materials known in the art can be included (step not shown) within the sealed region to further absorb trapped or diffused moisture. Multiple display units can be fabricated simultaneously using a single set of first and second substrates. If so, these multiple display units can be separated by dicing or scribing the substrates using methods known in the art (step not shown).

With the display unit completed in fabrication process 20, the fabrication process 10 for completing the OLED display device can continue. Returning to FIG. 1, following the fabrication of the display unit (fabrication process 20), a memory unit is provided (step 800). The memory unit can be selected from a variety of types known in the art such as flash memory, electrically programmable read only memory (EPROM), magnetic storage devices such as hard drives, and the like.

Next, the locations of any defective light producing elements as recorded in step 550 are stored in the memory unit (step 810). In order to reduce the size of the memory unit, a simple set of coordinates such as row number and column number for only the defective light producing elements is stored. Next, the adjusted locations of the color filter elements is stored in the memory unit (step 820). Again, in order to reduce the size of the memory unit, a simple set of coordinates such as row number and column number for only the color filter elements whose position has been changed are stored.

A driving unit is provided (step 830) to convert an incoming video image signal for display on the display unit. The driving unit includes a circuit, such as an application specific integrated circuit (ASIC). The driving unit determines the brightness level of the different pixels of the display unit is required to reproduce the video image. According to the present invention, the driving unit is also responsive to the locations of the defective light producing units and the adjusted positions of the color filter elements stored in the memory unit. As previously described, in the area of a defective white pixel, the driving unit can utilize the red, green, and blue pixels, including such color pixels comprising a color filter element whose locations has been adjusted, to reproducing the desired image colors in the absence of a functional white pixel. In another alternate embodiment, the memory unit can be made small by storing only the position of the defective light producing elements in the memory unit and generating the pattern for the array of color filter elements as needed during operation by supplying the logic algorithm for selecting adjusting the locations of the color filter elements in driving unit.

Finally, the driving unit, memory unit, and display unit are connected (step 840). The driving unit and memory unit can be connected by electrical connections on a circuit board which is then connected to the display unit by a flex cable. Alternately, the memory unit and driving unit can optionally be fabricated within a single integrated circuit such that they are connected by the integrated circuit wiring. Alternatively, either the memory unit or the driving unit, or both can be fabricated directly on the first substrate using thin film transistors such that a direct connection to the display unit is achieved.

Figure 8:
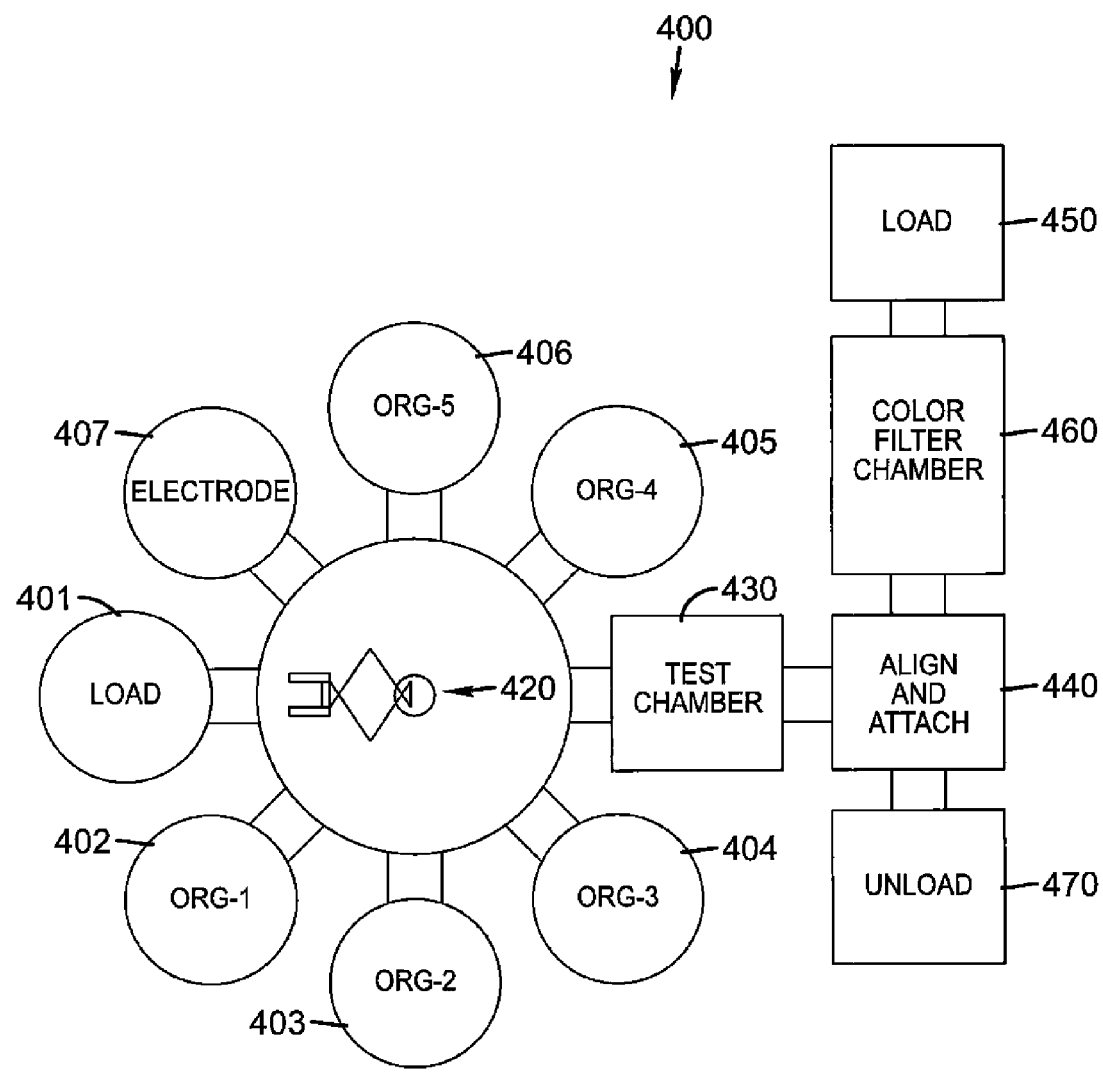
FIG. 8 shows an exemplary manufacturing tool having a series of chambers for making and OLED display device in accordance with the present invention.

Turning now to FIG. 8, a manufacturing tool 400 useful for practicing the present invention is shown. Manufacturing tool 400 includes a several chambers for maintaining a controlled environment located around a central chamber 410. Central chamber 410 contains a transfer robot 420 for moving substrates between chambers. Load chamber 401 is used to load substrates into a controlled environment (step 513). For a reduced pressure controlled environment, load chamber 401 includes a vacuum pump. Load chamber 401 can optionally hold a plurality of substrates so that multiple devices can be fabricated in parallel. Next, a first substrate is moved by way of transfer robot 420 into organic deposition chambers 402, 403, 404, 405, and 406 for depositing a plurality of organic sub-layers of the organic electroluminescent media (step 514). The organic deposition chambers may each contain one or more evaporation sources (or boats) for evaporating organic materials onto the first substrate. The organic sub-layers can be deposited on selective areas of the substrate through shadow masks loaded in each organic deposition chamber. Next, the first substrate is moved by way of transfer robot 420 into electrode deposition chamber 407 for deposition of the upper electrode 515 (step 515). The electrode deposition chamber 407 may contain one or more evaporation sources or sputter targets for depositing the transparent upper electrode material. The first substrate is then moved into the test chamber 430 by way of transfer robot 420.

Figure 9:
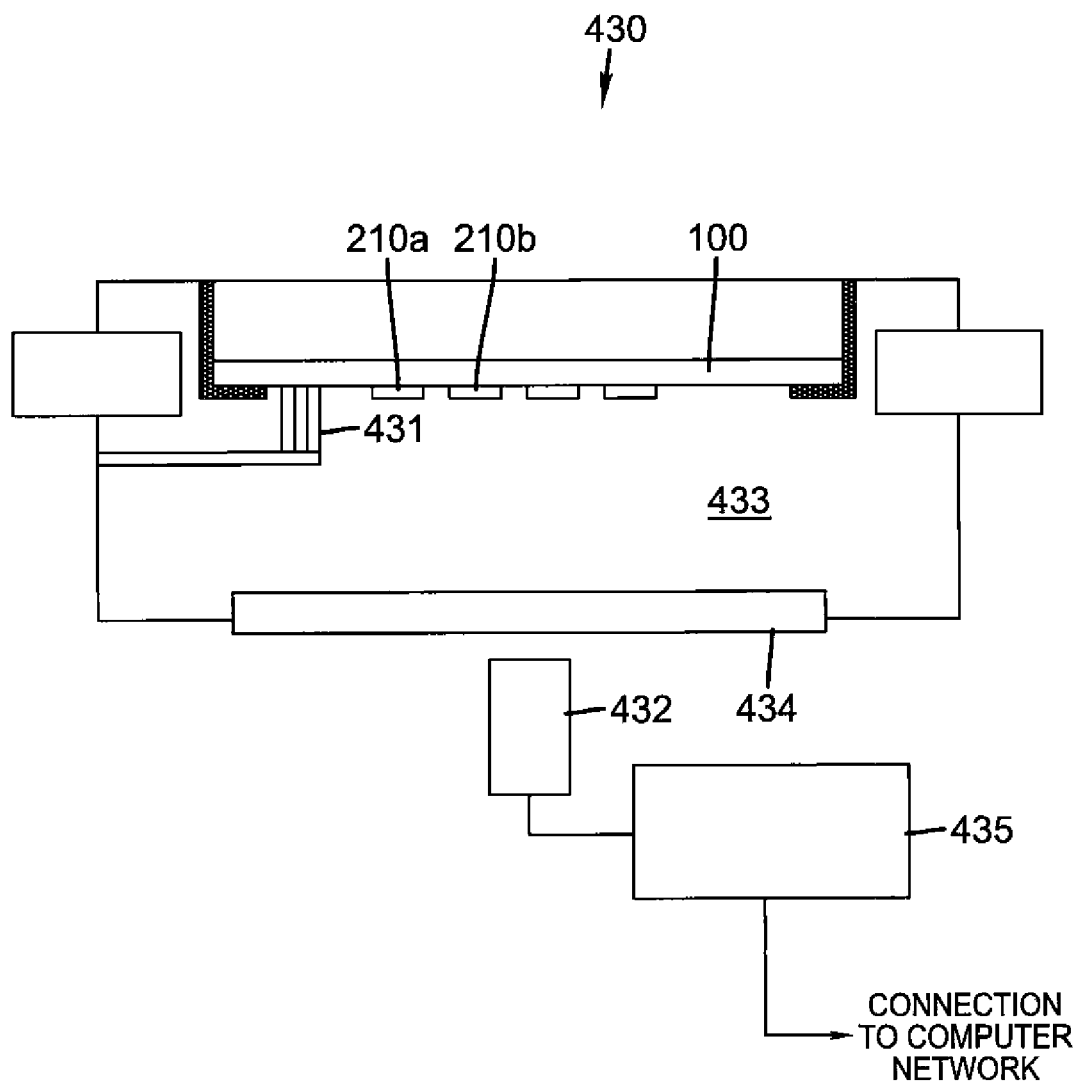
FIG. 9 shows a test chamber of the manufacturing tool of FIG. 8 in greater detail.

Turning now to FIG. 9, an example configuration of test chamber 430 is shown in more detail. Test chamber 430 contains an electrical probe 431 for providing power to the first substrate 100 and lighting the light producing elements, such as light producing elements 210*a* and 210*b*. The test chamber also contains a photo-detector 432 for detecting light emission from the light producing elements. Photo-detector 432 is shown as being located outside the controlled environment 433 and detects the light through window 434. However, the photo-detector can also be placed inside the controlled environment. The photo-detector is connected to a computer 435 which determines if any of the light producing elements are defective and stores the location information for the light producing elements, for example on a computer network.

Returning to FIG. 8, a second substrate is loaded into load chamber 450. The second substrate is then moved into a color filter chamber 460 for formation of the array of color filter elements. The second substrate is also maintained in a controlled environment, such as dry nitrogen or argon. The controlled environment is preferably introduced in the load chamber 450, however it can also be first introduced in the color filter chamber 460. Alternately, another load lock chamber can be installed before the align and attach chamber 440 to change environments. As previously described, several methods for forming the array of color filter elements may be employed, such as ink jet deposition or thermal transfer using a laser. An example of color filter chamber 460 for an ink jet deposition system is shown in FIG. 10.

Figure 10:
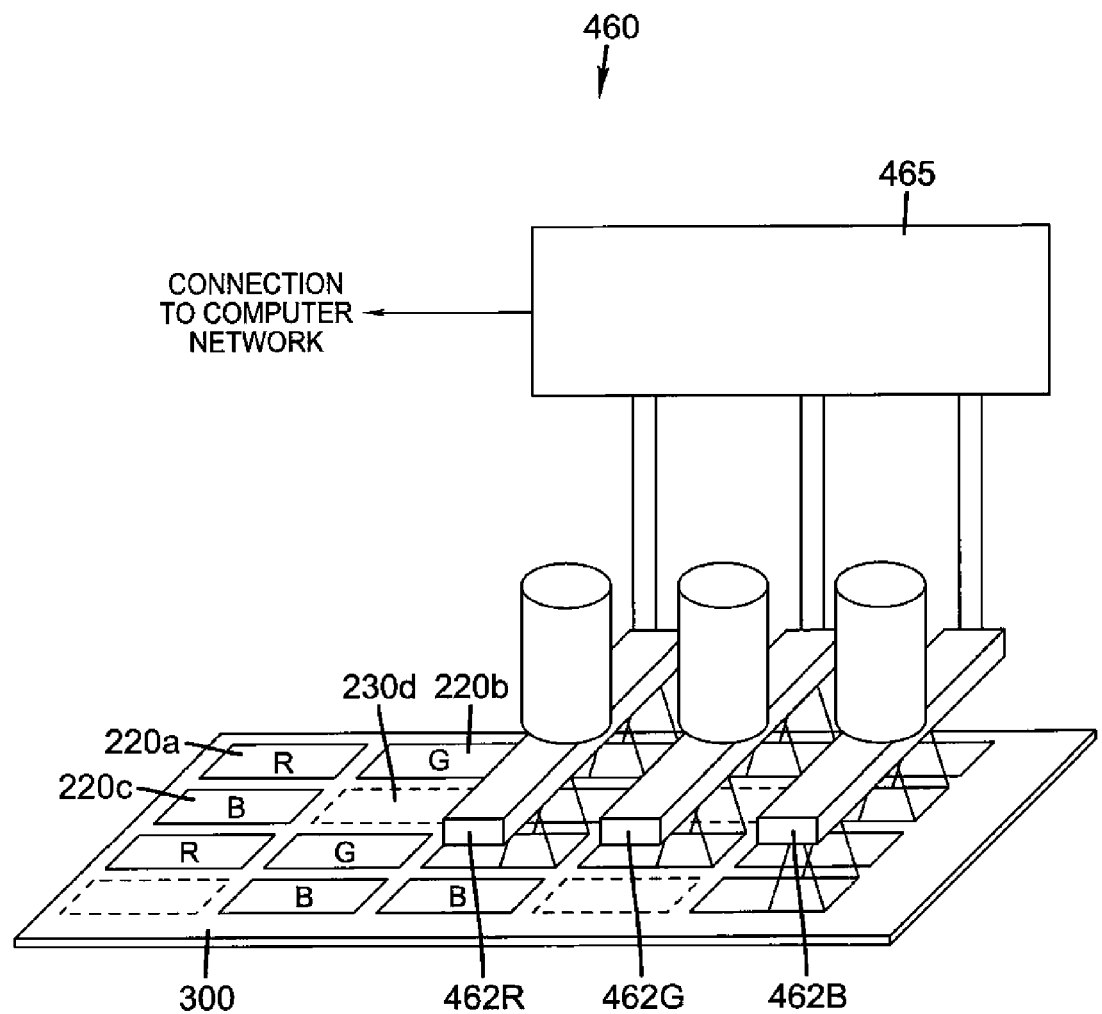
FIG. 10 shows a color filter chamber of the manufacturing tool of FIG. 8 in greater detail.

As shown in FIG. 10, an inkjet apparatus including a red inkjet head 462R, a green inkjet head 462G, and a blue inkjet head 462B is positioned to form the array of color filter elements such as color filter elements 220*a*, 220*b*, and 220*c* on the second substrate 300. Alternately, a single inkjet head could be utilized where a plurality of different colored filter materials are provided to the same head or same nozzles. The ink jet apparatus is controlled, for example, by a computer 465, which is connected to the computer network. Computer 465 receives the location information for the defective light producing elements recorded by test chamber 430. The computer 465 can then change the pattern of the array of color filter elements by adjusting the locations of the color filters such as color filter elements 220*a*, 220*b*, and 220*c* and also adjusting the locations of the unfiltered spaces such as unfiltered space 230*d*.

Returning now to FIG. 8, the first substrate is moved into the align and attach chamber 440. The align and attach chamber 440 is also maintained under a controlled environment. At this point, the controlled environment is changed to approximately atmospheric pressure with an inert gas such as dry nitrogen. The second substrate is then also moved into the align and attach chamber 440. The two substrates are then brought into alignment such that the array of light producing elements on the first substrate is aligned to the array of color filter elements on the second substrate. This can be achieved, for example, by use of a CCD alignment camera as is known in the art. The first substrate and second substrate are then attached way an adhesive dispensed between the substrates along their perimeters forming a seal. Optionally, a desiccating material can be dispensed between the two substrates within the adhesive seal as is known in the art. By attaching array of color filter elements on the second substrate to the array of light producing elements on the first substrate, a display unit is formed. The display unit is then moved to unload chamber 470 and removed from the manufacturing tool 400.

Figure 11:
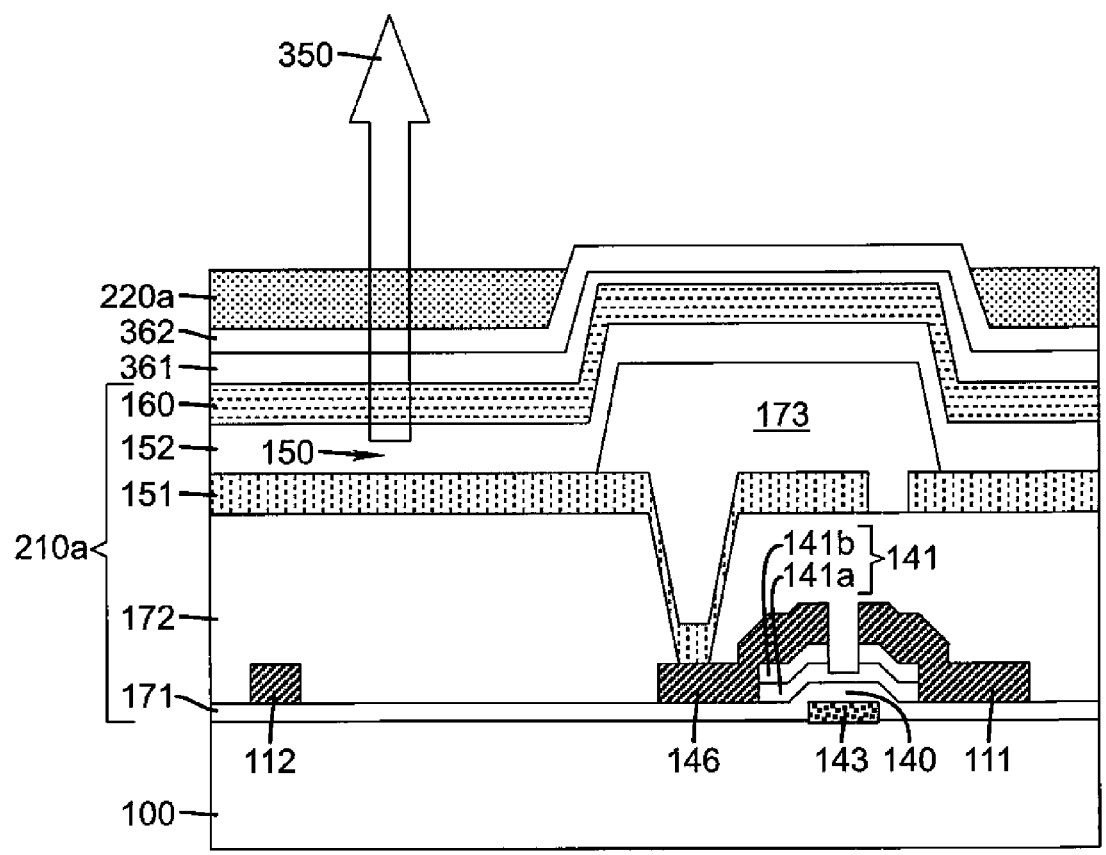
FIG. 11 shows a cross sectional view of an OLED display device according to a second embodiment of the present invention.

Turning now to FIG. 11, a cross-section of an OLED display device according to a second embodiment of the present invention is shown. In this embodiment, the array of color filter elements, such as color filter element 220a, are formed directly over the light producing elements, such as light producing element 210a which is formed over first substrate 100. This approach of forming the color elements directly over the light producing elements eliminates the need for a second substrate, which can reduce material costs, provide a thinner final display unit, and simplify the manufacturing equipment. As in the prior embodiments, the color filter elements are still preferably deposited by a mask-less process such as ink jet printing. As in the prior embodiments, the locations of the color filter elements are adjusted using the mask-less process in response to the recorded location of any defective light producing elements as determined by testing the array of light producing elements.

In this second embodiment, a protection layer 362 is preferably formed between the upper electrode 160 and the color filter elements, such as color filter element 220a. The protection layer 362 serves to prevent chemical degradation during the formation of the color filter elements, which may contain moisture or solvents, from degrading the underlying organic electroluminescent media 152 or the upper electrode 160. A thin film encapsulation layer 361 is also preferably provided to block moisture or air from degrading the underlying organic electroluminescent media 152 or the upper electrode 160. One preferred construction of the thin film encapsulation layer 361 is a layer of aluminum oxide deposited by a method such as Atomic Layer Deposition (ALD) over the upper electrode 160 followed by a protection layer 362 of a parylene compound formed over the aluminum oxide layers. Examples of such aluminum oxide and parylene sub-layers and other useful materials are described in described in U.S. Patent Application Publications US 2001/0052752 A1 and US 2002/0003403 A1. While use of the thin film encapsulation layer 361 and protection layer 362 are preferable, they are not required to successfully practice this embodiment of the present invention.

Figure 12:
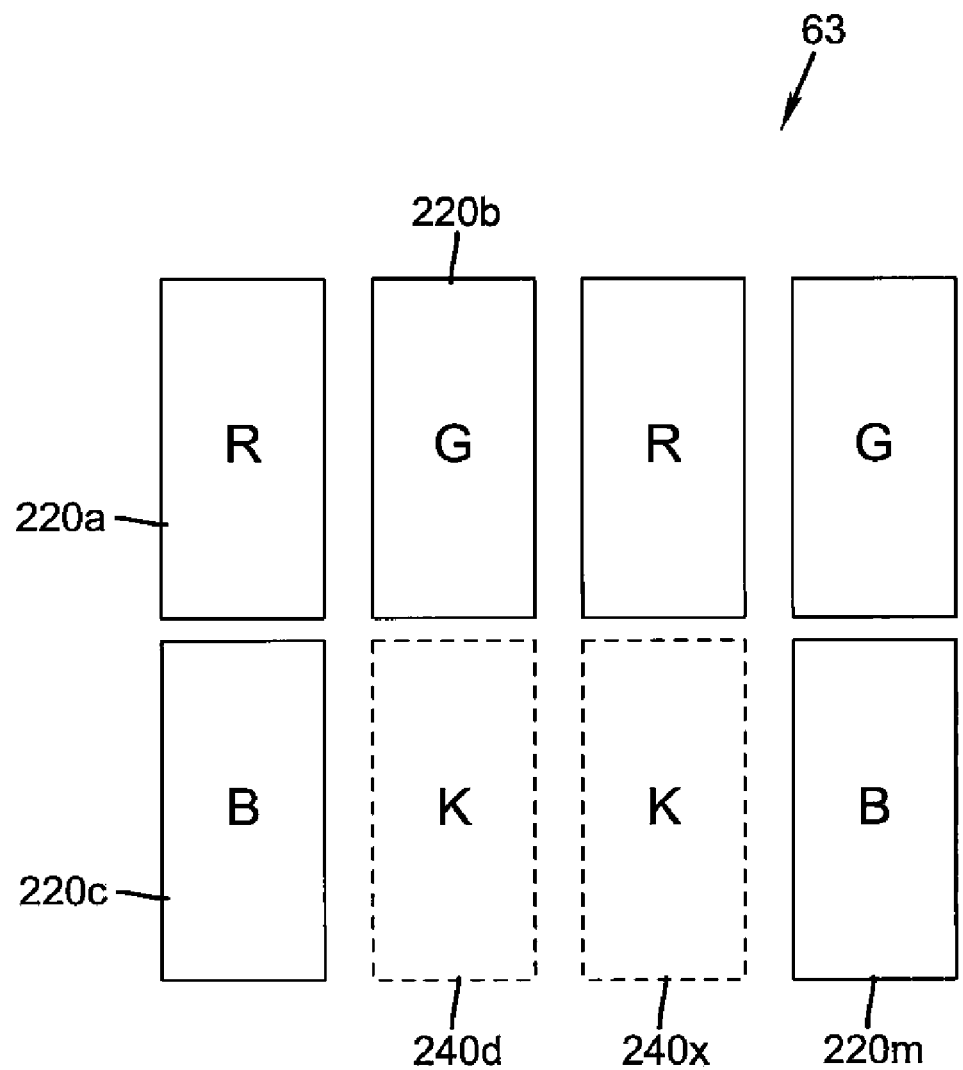
FIG. 12 shows an array of color filter elements including light blocking elements where the location of the color filter elements has been adjusted according to a third embodiment of the present invention.

A third embodiment of the present invention will now be discussed with reference to FIG. 12. This third embodiment differs from the first and second embodiments in that light blocking elements (such as a light blocking element 240d and a light blocking element 240x) are provided instead of unfiltered spaces as part of the array of color filter elements. That is, as seen in FIG. 12, an array of color filter elements 63 having color filter elements such as color filter elements 220a, 220b, 220c, and 220m is provided. Light blocking elements 240d and 240x are also provided. This array of color filter elements 63 can be coupled with the array of light producing elements 52 of the first embodiment which has been previously described and is shown in FIG. 5A.

The array of color filter elements 63 includes a pattern of color filter elements which are red (R), green (G), and blue (B) in color. The pattern also includes light blocking elements such as light blocking element 240d which is black (K) is color. These light blocking elements are highly absorptive across the visible wavelengths and can be composed of carbon black or other dyes or pigments or mixtures of dyes or pigments which absorb across the visible wavelengths. When coupled to an array of light producing elements, this results in a display having red, green, and blue pixels or an RGB type display. In this case, 1 out of each 4 light producing elements is not used in producing an image. The unused light producing element appears to be black (or dark) due to the presence of the light blocking elements.

The default pattern of the array of color filter elements is changed in response to the detected presence of a defective light producing element. In this case, the position of a light blocking element, such as light blocking element 240x is changed to be over the defective light producing element. The position of a color filter element (such as color filter element 220m) that would have been associated with the defective light producing element is changed to be over a non-defective light producing element. As such, a display device having complete sets of function RGB pixels can be formed despite the presence of the defective light producing elements. This third embodiment of the present invention having light blocking elements can be practiced where the array of light producing elements is formed over a second substrate (as in the first embodiment) or directly over the light producing elements over the first substrate (as in the second embodiment).

The invention has been described in detail with particular reference to certain preferred embodiments thereof, but it will be understood that variations and modifications can be effected within the spirit and scope of the invention.

PARTS LIST 10 fabrication process
20 fabrication process
51 array of light producing elements
52 array of light producing elements
61 array of color filter elements
62 array of color filter elements
63 array of color filter elements
100 first substrate
111 power line
112 data line
113 select line
120 select transistor
130 storage capacitor
140 drive transistor
141 semiconductor
141a undoped sub-layer
141b doped sub-layer
143 gate terminal
146 terminal
150 organic light emitting diode
150x organic light emitting diode
151 lower electrode
152 organic electroluminescent media
160 common upper electrode
170 short circuit defect
171 insulator layer
172 insulator layer
173 inter-pixel insulator layer
210a light producing element Parts List cont'd
210b light producing element
210c light producing element
210d light producing element
210e light producing element
210f light producing element
210m light producing element
210x light producing element
220a color filter element
220b color filter element
220c color filter element
220m color filter element
230d unfiltered space
230x unfiltered space
240d light blocking element
240x light blocking element
300 second substrate
310 black matrix
350 light emission
361 thin film encapsulation layer
362 protection layer
400 manufacturing tool
401 load chamber
402 deposition chamber
403 deposition chamber
404 deposition chamber
405 deposition chamber
406 deposition chamber
407 electrode deposition chamber Parts List cont'd
410 central chamber
420 transfer robot
430 test chamber
431 electrical probe
432 photo-detector
433 controlled environment
434 window
435 computer
440 align and attach chamber
450 load chamber
460 color filter chamber
462B blue ink jet head
462G green ink jet head
462R red ink jet head
465 computer
470 unload chamber
500 step
510 step
511 step
512 step
513 step
514 step
515 step
520 step
530 decision block
540 step
550 step
560 step Parts List cont'd
570 step
580 step
590 step
600 step
700 decision block
710 step
720 step
800 step
810 step
820 step
830 step
840 step

The invention claimed is:

1. A method of making an OLED display device for producing an image comprising:
 a) forming an array of light producing elements;
 b) testing the array of light producing elements and recording the location of defective light producing element(s);
 c) providing a default pattern of an array of color filter elements having at least two different colors; and
 d) forming an array of color filter elements in response to the recorded location of the defective light producing element(s), the location of at least one color filter element being changed from the default pattern.

2. The method of claim 1 further comprising:
 e) providing a memory unit;
 f) storing the locations of the defective light producing element(s), the adjusted locations of the color filter elements, or both in the memory unit; and
 g) providing an electronic driving unit for driving the array of light producing elements in response to a video signal and the stored locations in the memory unit.

3. The method of claim 1 further including the step of forming active matrix circuitry.

4. The method of claim 1 wherein the light producing elements produce light having a broadband emission.

5. The method of claim 4 wherein the array of color filter elements includes a plurality of red, green, and blue color filter elements.

6. The method of claim 5 wherein the color filter elements of the array of color filter elements being spaced to form a plurality of unfiltered spaces and the array of light producing elements includes a plurality of light producing elements aligned to the red color filter elements forming red pixels, a plurality of light producing elements aligned to the green color filter elements forming green pixels, a plurality of light producing elements aligned to the blue color filter elements forming blue pixels, and a plurality of light emitting elements aligned to the unfiltered spaces forming broadband pixels.

7. The method of claim 6 wherein the locations of one or more of the color filter elements being changed relative to the default pattern in response to the recorded locations of the defective light producing elements such that the defective light producing elements are aligned to the unfiltered spaces.

8. The method of claim 1 wherein the color filter elements of the array of color filter elements being spaced to form a plurality of unfiltered spaces and the array of light producing elements includes a plurality of light emitting elements aligned to the unfiltered spaces forming broadband pixels.

9. The method of claim 8 wherein the locations of one or more of the color filter elements are adjusted in response to the recorded locations of the defective light producing elements such that the defective light producing elements are aligned to the unfiltered spaces.

10. The method of claim 1 further including forming an array of light blocking elements wherein the location of one or more the light blocking elements is adjusted in response to the recorded location of the defective light producing elements.

11. The method of claim 10 wherein the locations of one or more of the light blocking elements are adjusted in response to the recorded location of the defective light producing elements such that the defective light producing elements are aligned to the light blocking elements.

12. The method of claim 1 wherein the color filter elements are formed using a ink jet deposition.

13. The method of claim 1 wherein the color filter elements are formed by transferring the color filter material from a donor sheet.

14. The method of claim 1 wherein the color filter elements are formed using a mask-less patterning process.

15. The method of claim 1 wherein the testing of the array of light producing elements is performed in an inert or reduced pressure environment.

16. The method of claim 1 wherein the testing of the array of light producing elements includes providing electrical power to the array of light producing elements and measuring the light output of each light producing element.

17. A method of fabricating an OLED display device for producing a video image comprising:
   a) providing a first substrate and a second substrate;
   b) forming an array of light producing elements over the first substrate;
   c) testing the first substrate and recording the location of defective light producing element(s);
   d) providing a default pattern of an array of color filter elements having at least two different colors;
   e) forming an array of color filter elements over the second substrate in response the recorded location of the defective light producing element(s), the location of at least one color filter element being changed from the default pattern; and
   f) attaching the first substrate to the second substrate such that the array of color filter elements is in alignment with at least a portion of the array of light producing elements.

18. The method of claim 17 wherein the light producing elements and the color filter elements are disposed between the first and second substrates.

* * * * *